United States Patent
Wang

(10) Patent No.: US 8,071,413 B2
(45) Date of Patent: Dec. 6, 2011

(54) MICRO-ELECTRO-MECHANICAL SYSTEM (MEMS) SENSOR AND METHOD FOR MAKING SAME

(75) Inventor: Chuan Wei Wang, HsinChu (TW)

(73) Assignee: PixArt Imaging Incorporation, R.O.C., Hsin-Chu (TW)

( * ) Notice: Subject to any disclaimer, the term of this patent is extended or adjusted under 35 U.S.C. 154(b) by 11 days.

(21) Appl. No.: 13/080,012

(22) Filed: Apr. 5, 2011

(65) Prior Publication Data
US 2011/0183455 A1    Jul. 28, 2011

Related U.S. Application Data

(62) Division of application No. 12/391,551, filed on Feb. 24, 2009.

(51) Int. Cl.
*H01L 21/00* (2006.01)

(52) U.S. Cl. .......... 438/50; 257/254; 257/415; 257/419; 438/22; 438/24; 438/48; 438/52; 438/53; 216/2; 216/11; 216/75; 216/79; 381/174; 73/66; 73/464; 73/514.6; 73/570; 73/574; 73/575; 73/584; 73/777; 73/780

(58) Field of Classification Search .............. 257/254, 257/415–419; 438/22, 24, 48, 50, 52, 53; 216/2, 11, 75, 79; 73/66, 464, 514.16, 570, 73/574, 575, 584, 724, 777–780; 381/174
See application file for complete search history.

(56) References Cited

U.S. PATENT DOCUMENTS

| | | | |
|---|---|---|---|
| 6,012,336 A | | 1/2000 | Eaton et al. |
| 6,146,543 A | * | 11/2000 | Tai et al. ............. 216/2 |
| 6,536,281 B2 | | 3/2003 | Abe et al. |
| 6,743,654 B2 | | 6/2004 | Coffa et al. |
| 6,928,879 B2 | | 8/2005 | Partridge et al. |
| 7,121,146 B1 | | 10/2006 | Hopper et al. |
| 7,135,149 B2 | | 11/2006 | DeSilets et al. |
| 2004/0253755 A1 | * | 12/2004 | Chen et al. ............. 438/21 |
| 2005/0249041 A1 | * | 11/2005 | Pedersen ............. 367/179 |
| 2006/0078137 A1 | * | 4/2006 | Su et al. ............. 381/191 |
| 2006/0236537 A1 | * | 10/2006 | Chen et al. ............. 29/890.01 |
| 2007/0201710 A1 | * | 8/2007 | Suzuki et al. ............. 381/174 |
| 2007/0284682 A1 | * | 12/2007 | Laming et al. ............. 257/416 |
| 2008/0137884 A1 | * | 6/2008 | Kim et al. ............. 381/174 |
| 2008/0137886 A1 | * | 6/2008 | Schrank ............. 381/174 |
| 2009/0166772 A1 | * | 7/2009 | Hsieh et al. ............. 257/415 |

* cited by examiner

*Primary Examiner* — Meiya Li
(74) *Attorney, Agent, or Firm* — Tung & Associates

(57) ABSTRACT

The present invention discloses an MEMS sensor and a method for making the MEMS sensor. The MEMS sensor according to the present invention includes: a substrate including an opening; a suspended structure located above the opening; and an upper structure, a portion of which is at least partially separated from a portion of the suspended structure; wherein the suspended structure and the upper structure are separated from each other by a step including metal etch.

11 Claims, 3 Drawing Sheets

MICRO-ELECTRO-MECHANICAL SYSTEM (MEMS) SENSOR AND METHOD FOR MAKING SAME

This is a Divisional of a co-pending application Ser. No. 12/391,551, filed on Feb. 24, 2009.

BACKGROUND

1. Field of Invention

The present invention relates to a micro-electro-mechanical system (MEMS) sensor, in particular to a MEMS pressure sensor; the present invention also relates to a method for making such MEMS sensor, which is compatible to standard CMOS process.

2. Description of Related Art

MEMS devices are used in a wide variety of products; examples of such applications are absolute and relative sensors such as blood pressure sensor and micro-acoustical microphone. U.S. Pat. Nos. 6,012,336; 6,536,281; 6,928,879; 7,121,146; 6,743,654; and 7,135,149 are relevant art, but the processes employed in these prior art either are too complicated or require equipment or materials which are not compatible to or not standard in CMOS process. A MEMS sensor having a structure which can be manufactured by a standard CMOS process is desired in this industry.

SUMMARY OF THE INVENTION

It is an objective of the present invention to provide a MEMS sensor which can be manufactured by a process fully compatible to the present standard CMOS process.

It is another objective of the present invention to provide a method for making such MEMS sensor.

In accordance with the foregoing and other objectives of the present invention, from one aspect, the present invention discloses a method for making a MEMS sensor, comprising: providing a substrate; forming interconnection on the substrate, part of the interconnection forming an etchable structure separating at least a portion of a suspended structure of the MEMS sensor from the rest of the MEMS sensor; etching the back side of the substrate to expose the etchable structure; and etching the etchable structure.

From another aspect, the present invention discloses a MEMS sensor comprising: a substrate including an opening; a suspended structure located above the opening; and an upper structure, a portion of which is at least partially separated from a portion of the suspended structure; wherein the suspended structure and the upper structure are separated from each other by a step including metal etch.

In the above MEMS sensor and the method, the back side of the substrate can be sealed by hermetical package so that the MEMS sensor becomes an absolute sensor. The material for hermetical package for example can be silicon or glass.

The sensor can further comprise a guard ring encompassing the suspended structure.

It is to be understood that both the foregoing general description and the following detailed description are provided as examples, for illustration and not for limiting the scope of the invention.

BRIEF DESCRIPTION OF THE DRAWINGS

These and other features, aspects, and advantages of the present invention will become better understood with regard to the following description, appended claims, and accompanying drawings.

DESCRIPTION OF THE PREFERRED EMBODIMENTS

The drawings as referred to throughout the description of the present invention are for illustration only, but not drawn according to actual scale.

Figure 1A:
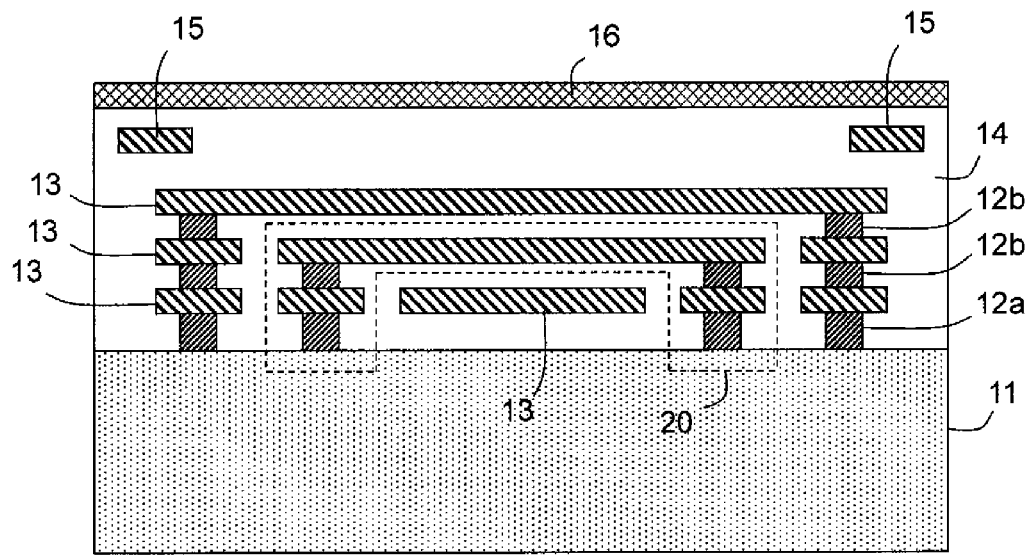
FIGS. 1A-1E show an embodiment according to the present invention.

Referring to FIG. 1A for the first embodiment of the present invention, a zero-layer wafer substrate 11 is provided, which for example can be a silicon wafer so that the process is compatible with a standard CMOS process. Next, transistor devices can be formed by standard CMOS process steps as required (not shown), followed by deposition, lithography and etch steps to form interconnection including a contact layer 12a, metal layers 13, and via layers 12b. A dielectric layer 14 is provided to isolate the metal patterns of the layers where there should not be connection. Furthermore, a bond pad pattern 15 is formed on the topmost metal layer, and a passivation layer 16 is formed on top of the overall structure. In one embodiment, the contact layer 12a and the via layers 12b can be made of tungsten; the metal layers 13 can be made of aluminum; and the dielectric layer 14 can be made of oxides such as silicon dioxide. Other conductive or dielectric materials can be used to replace what are suggested above, and the structure can include more or less number of metal layers.

In the shown structure, between the innermost first metal layer 13 and the outermost metal structure (item 30 of FIG. 1C, referred to also as the "upper structure" hereinafter), an etchable structure 20 is formed which includes a portion of the contact layer 12a, metal layers 13, and a via layer 12b. The purpose of the etchable structure 20 is to define a suspended structure of the MEMS device, which will become clearer as referring to the following process steps. The outermost metal structure can either provide a guard ring function to protect the circuitry (not shown) from etch damage or moisture, or act as an upper electrode (to be explained later).

Figure 1B:
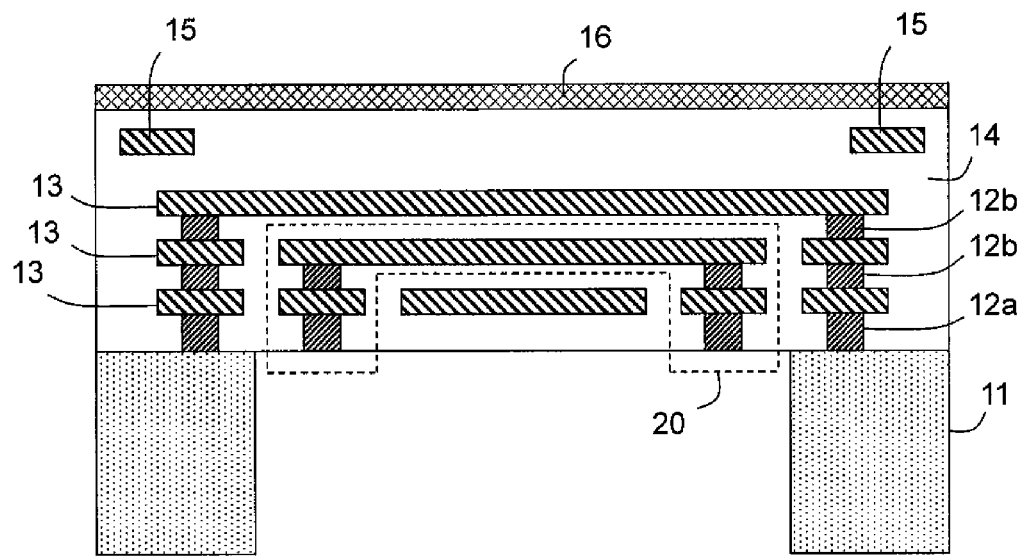

Referring to FIG. 1B, the back side of the substrate 11 is subject to an etch, such as an ICP (Inductively Coupled Plasma) DRIE (Deep Reactive Ion Etch), to forming an opening exposing the etchable structure 20.

Figure 1C:
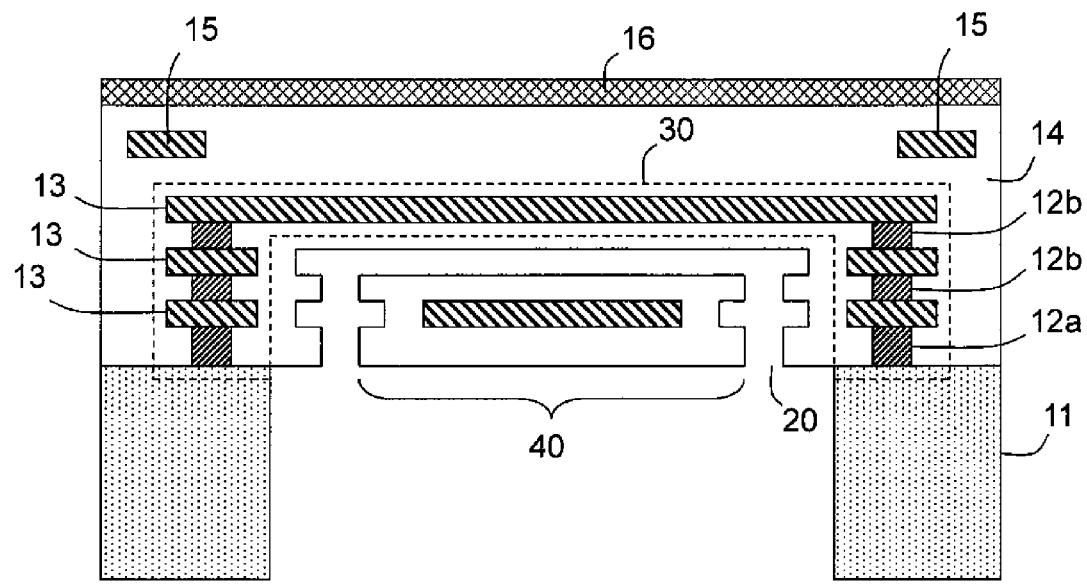

Referring to FIG. 1C, the etchable structure 20 is etched away to leave a space 20 which separates the suspended structure 40 from the rest of the MEMS device. The etch can for example can be wet etch by sulfide acid and hydrogen peroxide solution. Note that the term "separate" in the context of this specification means "at least partially disconnected" but does not have to be "totally disconnected". In a position not shown in this figure, the suspended structure 40 is still connected with the zero-layer wafer substrate 11. In one application, the suspended structure 40 functions as a lower electrode and fixed to the substrate; it does not deform during operation of the sensor. On the other hand, the upper structure 30 functions as an upper electrode; its uppermost metal layer 13, or a composite layer of the uppermost metal layer 13, part of the dielectric layer 14 and part of the passivation layer 16, form a thin film structure which elastically deforms during operation of the sensor according to acoustical or air pressure variation. The deformation causes a change of the capacitance.

Figure 1D:
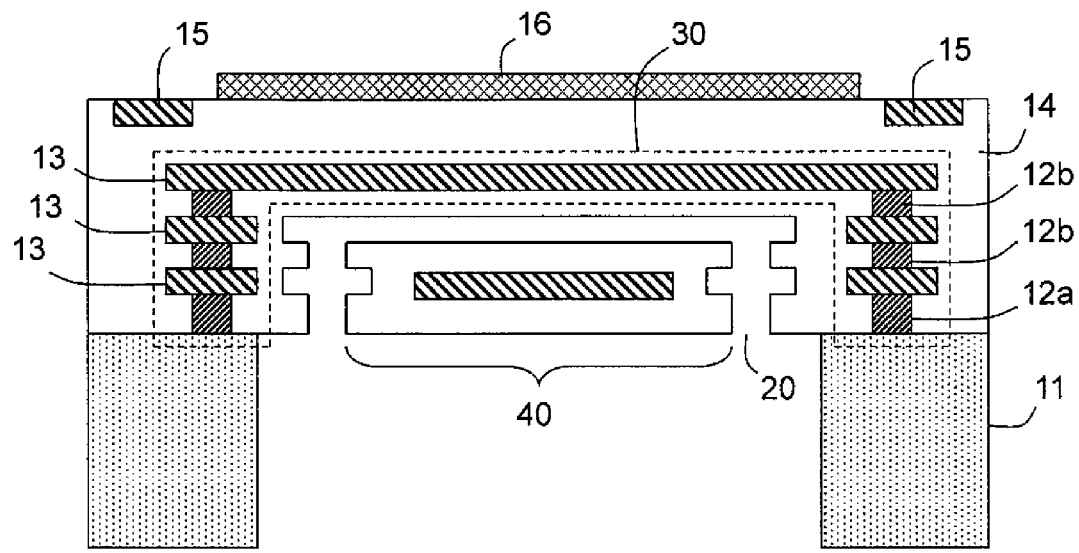

After the etchable structure 20 is etched, as shown in FIG. 1D, part or all of the passivation layer 16 can be removed by lithography and etch, to open the bond pads 15 at the topmost layer of the interconnection. If the upper structure 30 is used as an upper electrode and it is desired to reduce the thickness of the upper electrode thin film, the passivation layer 16 above the upper electrode, or together with the dielectric layer 14 above the upper electrode, can removed in this step.

Figure 1E:
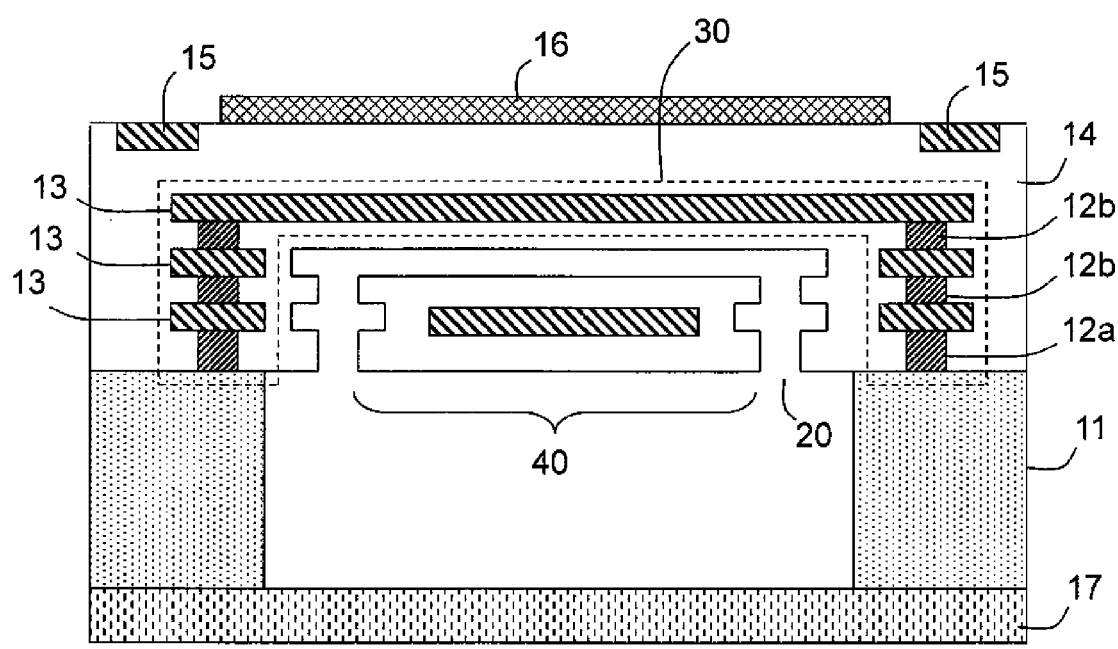

If what is intended to make is a relative sensor such as acoustical sensor or accelerometer, the process can stop here. If what is intended to make is an absolute sensor, referring to FIG. 1E, preferably, a hermetical package is formed on the back side of the zero-layer wafer substrate 11 by a sealing material 17, which for example can be silicon or glass.

The foregoing process is superior to the prior art because it is fully compatible with standard CMOS process. By such process, a MEMS device and CMOS devices can be made on the same chip in a CMOS fab conveniently.

Although the present invention has been described in detail with reference to certain preferred embodiments thereof, the description is for illustrative purpose and not for limiting the scope of the invention. One skilled in this art can readily think of other modifications and variations in light of the teaching by the present invention. For example, the materials, number of metal layers, etch in the shown embodiments are provided as examples; they can be modified in many ways. As another example, the outermost metal structure does not have to form a guard ring. Therefore, all such modifications and variations should be interpreted to fall within the scope of the following claims and their equivalents.

What is claimed is:

1. A method for making a MEMS sensor, the method comprising:
    providing a substrate;
    forming interconnection on the substrate, the interconnection including a metal structure, a suspended structure, and an etchable structure, the etchable structure at least separating a portion of the metal structure from a portion of the suspended structure; wherein the etchable structure including metal layers;
    etching the back side of the substrate to expose the etchable structure; and
    etching the etchable structure to form a space between the suspended structure and the metal structure.

2. The method of claim 1, wherein in the step of etching the back side of the substrate, the metal structure and the suspended structure are not exposed.

3. The method of claim 1, further comprising: sealing the back side of the substrate by a hermetical package.

4. The method of claim 3, wherein the hermetical package includes a material of silicon or glass.

5. The method of claim 1, further comprising: forming a passivation layer on the interconnection, and etching the passivation layer to expose a bond pad which is electrically connected with the interconnection.

6. The method of claim 1, wherein the interconnection forms a guard ring encompassing the suspended structure.

7. The method of claim 1, wherein the interconnection includes metal layers made of a material including aluminum, and contact and via layers made of a material including tungsten, and wherein the step of etching the etchable structure includes using sulfide acid and hydrogen peroxide solution.

8. The method of claim 1, wherein the substrate is a silicon substrate, and the step of etching the back side of the substrate includes ICP etch (Inductively Coupled Plasma etch).

9. The method of claim 1, wherein the metal structure and the suspended structure form upper and lower electrodes, respectively.

10. The method of claim 5, further comprising: etching to remove the passivation layer above the metal structure.

11. The method of claim 1, further comprising: forming a dielectric layer on the substrate, and etching to remove the dielectric layer above the metal structure.

* * * * *